United States Patent
Kimura et al.

[11] Patent Number: 6,096,130
[45] Date of Patent: Aug. 1, 2000

[54] METHOD OF CRYSTAL GROWTH OF A GAN LAYER OVER A GAAS SUBSTRATE

[75] Inventors: Akitaka Kimura; Haruo Sunakawa; Masaaki Nido, all of Tokyo, Japan

[73] Assignee: NEC Corporation, Tokyo, Japan

[21] Appl. No.: 08/824,017

[22] Filed: Mar. 21, 1997

[30]     Foreign Application Priority Data

Mar. 22, 1996   [JP]   Japan .................................. 08-065644

[51] Int. Cl.⁷ .................................................. C30B 25/14
[52] U.S. Cl. .............................. 117/89; 117/94; 117/101; 117/952
[58] Field of Search .............................. 117/89, 94, 101, 117/952; 438/45, 46, 47

[56]             References Cited

U.S. PATENT DOCUMENTS

| | | | |
|---|---|---|---|
| 5,756,374 | 5/1998 | Miura, et al. | 438/46 |
| 5,814,533 | 9/1998 | Shakuda | 438/46 |
| 5,843,227 | 12/1998 | Kimura, et al. | 117/101 |

FOREIGN PATENT DOCUMENTS

| | | | |
|---|---|---|---|
| 4187598 | 7/1992 | Japan | C30B 29/38 |
| 7273048 | 10/1995 | Japan | H01L 21/205 |

OTHER PUBLICATIONS

Fujieda et al; "Structure Control of GaN Films Grown on (001) GaAs Substrates by GaAs Surface Pretreatments"; Sep. 1991; pp. 1665–1667; Japanese Journal of Applied Physics.

Strite et al ; "An investigation of the properties of cubic GaN grown on GaAs by plasma–assisted molecular–beam epitaxy"; Jul./Aug. 1991; pp. 1924–1929; J. Vac. Sci. Technol. B 9 (4).

Nakamura; "InGaN/AlGaN blue–light–emitting diodes"; May/Jun. 1995; pp. 705–710; J. Vac. Science Technology, No. 13, vol. 3.

Guo et al; "Growth of InN films on GaAs (111) and GaP (111) substrates by microwave–excited metalorganic vapor phase epitaxy"; Feb. 6, 1995; pp. 715–717;Applied Phys. Lett. 66 (6).

Okumura et al; "Epitaxial growth of cubic and hexagonal GaN on GaAs by gas–source molecular–beam epitaxy"; pp. 1058–1060; Applied Phys. Lett. 59 (9).

*Primary Examiner*—Felisa Hiteshew
*Attorney, Agent, or Firm*—Hayes Soloway Hennessey Grossman & Hage PC

[57]                ABSTRACT

A method of crystal growth of a GaN layer with an extremely high surface planarity over a GaAs substrate is provided, wherein a GaAs substrate is heated to a temperature in the range of 600° C. to 700° C. without supplying any group-V element including arsenic to form a Ga-rich surface on the GaAs substrate, before a first source material including N and a second source material including Ga are supplied along with a carrier gas onto a surface of the GaAs substrate to form a GaN layer over the GaAs substrate.

17 Claims, 7 Drawing Sheets

101 : GaAs substrate
104 : Ga-rich surface formed by a heat treatment
105 : GaN low temperature growth buffer layer
106 : GaN high temperature growth layer

FIG. 1 prior art

701 : sapphire substrate
702 : n-GaN low temperature growth buffer layer
703 : n-GaN layer
704 : n-$Al_{0.15}Ga_{0.85}N$ layer
705 : $In_{0.06}Ga_{0.94}N$ layer
706 : p-$Al_{0.15}Ga_{0.85}N$ layer
707 : p-GaN layer
708 : p-electrode
709 : n-electrode

FIG. 2 prior art

101 : GaAs substrate
103 : Ga-rich surface
105 : GaN low temperature growth buffer layer
106 : GaN high temperature growth buffer layer

FIG. 3 prior art

Scanning Electron Microscopy Photograph

FIG. 4

101 : GaAs substrate
104 : Ga-rich surface formed by a heat treatment
105 : GaN low temperature growth buffer layer
106 : GaN high temperature growth layer

FIG. 5

101 : GaAs substrate
102 : GaAs buffer layer
104 : Ga-rich surface formed by a heat treatment
105 : GaN low temperature growth buffer layer
106 : GaN high temperature growth layer

FIG. 6

Scanning Electron Microscopy Photograph

FIG. 7

Scanning Electron Microscopy Photograph

FIG. 8

Scanning Electron Microscopy Photograph

FIG. 9

Scanning Electron Microscopy Photograph

METHOD OF CRYSTAL GROWTH OF A GAN LAYER OVER A GAAS SUBSTRATE

BACKGROUND OF THE INVENTION

The present invention relates to a method of crystal growth of a gallium nitride layer on gallium arsenide, and more particularly to a method of crystal growth of a gallium nitride layer with an extremely flat surface on gallium arsenide.

Gallium nitride, for application having a large energy band gap, offers a great deal of promise to various light emitting devices such as light emission diodes and semiconductor laser devices. Generally, gallium nitride is formed by crystal growth on a single crystal substrate.

Figure 1:
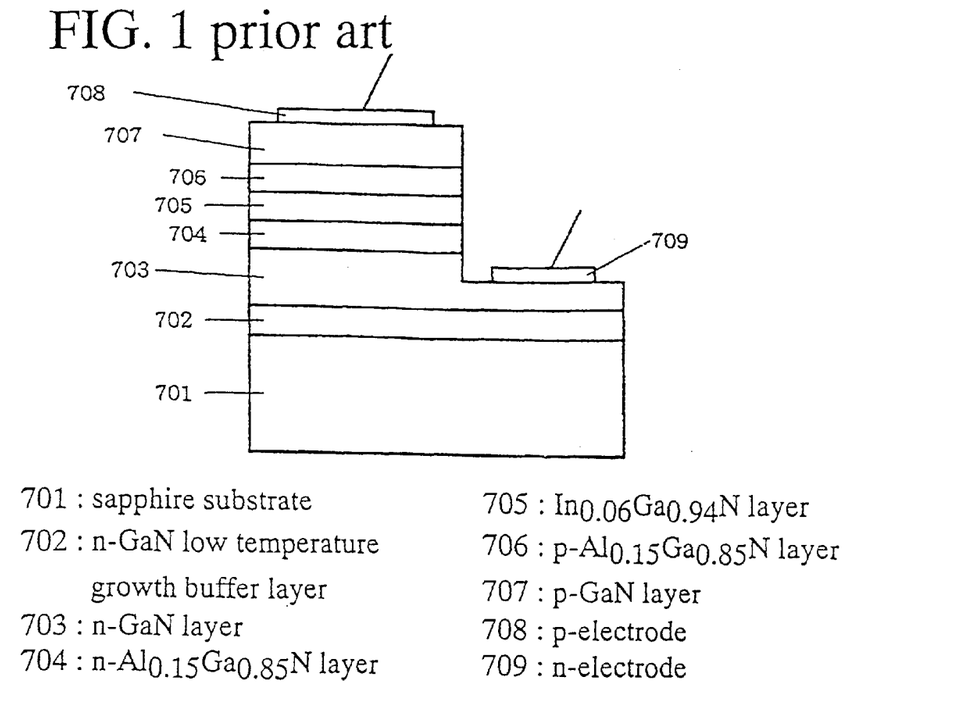
FIG. 1 (Prior Art) is a fragmentary cross sectional elevation view illustrative of a conventional light emitting diode including a GaN layer formed over a sapphire substrate.

Sapphire substrate has been most frequently used for crystal growth of a gallium nitride layer thereon. It was reported by S. Nakamura in J. Vac. Sci. Technol. Vol. 13, No. 3, p. 705, May/June 1995 that a light emission diode has a multilayer structure including a gallium nitride layer over a sapphire substrate. FIG. 1 is illustrative of this conventional light emitting diode. The conventional light emitting diode is formed over a (0001) surface of a sapphire substrate 701. An n-GaN low temperature growth buffer layer 702 is grown at a low temperature of 510° C. over the sapphire substrate 701. The n-GaN low temperature growth buffer layer 702 has a thickness of 30 nanometers. An n-GaN layer 703 doped with silicon is formed at a temperature of 1020° C. over the n-GaN low temperature growth buffer layer 702. The n-GaN layer 703 has a thickness of 4 micrometers. An n-$Al_{0.15}Ga_{0.85}N$ layer 704 doped with silicon is formed at a temperature of 1020° C. over the n-GaN layer 703. The n-$Al_{0.15}Ga_{0.85}N$ layer 704 has a thickness of 0.15 micrometers. An $In_{0.06}Ga_{0.94}N$ layer 705 doped with silicon and zinc is formed at a temperature of 800° C. over the n-$Al_{0.15}Ga_{0.85}N$ layer 704. The $In_{0.06}Ga_{0.94}N$ layer 705 has a thickness of 100 nanometers. A p-$Al_{0.15}Ga_{0.85}N$ layer 706 doped with magnesium is formed at a temperature of 1020° C. over the $In_{0.06}Ga_{0.94}N$ layer 705. The p-$Al_{0.15}Ga_{0.85}N$ layer 706 has a thickness of 0.15 micrometers. A p-GaN layer 707 doped with magnesium is formed at a temperature of 1020° C. over the p-$Al_{0.15}Ga_{0.85}N$ layer 706. The p-GaN layer 707 has a thickness of 0.5 micrometers. A p-electrode 708 is formed on the p-GaN layer 707. The p-electrode 708 comprises double layers of nickel and gold. An n-electrode 709 is formed on a surface of the n-GaN layer 703. The n-electrode 709 comprises double layers of titanium and aluminum.

A GaN layer grown on the sapphire substrate has a better planarity and higher crystal quality than a GaN layer grown on other substrates. However, a sapphire substrate is not conductive and has a difficulty for cleavage thereof. Further, there are not available prior art process techniques for when GaAs substrate and InP substrate are used. When a sapphire substrate is used, it is necessary that both the p-electrode and n-electrode are formed on surfaces of the device, for which reason the processes for forming the electrodes are complicated.

On a other hand, if the GaAs substrate is used for formation of the GaN layer, then the GaAs substrate is electrically conductive and it is possible to make a cleavage thereof. Further, it is possible to employ prior art process techniques when GaAs substrate and InP substrate are used. It is disclosed by Qintin Guo and Hiroshi Ogawa, in Appl. Phys. Lett. 66, 715 (1995) that a GaN layer may be grown on a (111) surface of a GaAs substrate. It is also disclosed by in Appl. Phys. Lett. 78, 1842 (1995) that a GaN layer may be grown on a (100) surface of a GaAs substrate. If, however, an initial nitrization of a GaAs surface is not sufficient, then it is difficult to obtain high crystal quality of a GaN layer over a GaAs substrate. The GaN layer over a GaAs substrate is inferior in planarity than the GaN layer over a sapphire substrate. This problem is disclosed in Appl. Phys. Lett. 59, 1058 (1991), and Japan J. Appl. Phys. Lett. 30, L1665 (1991), and J. Vac. Sci. Technol. B9, 1924 (1991).

Figure 2:
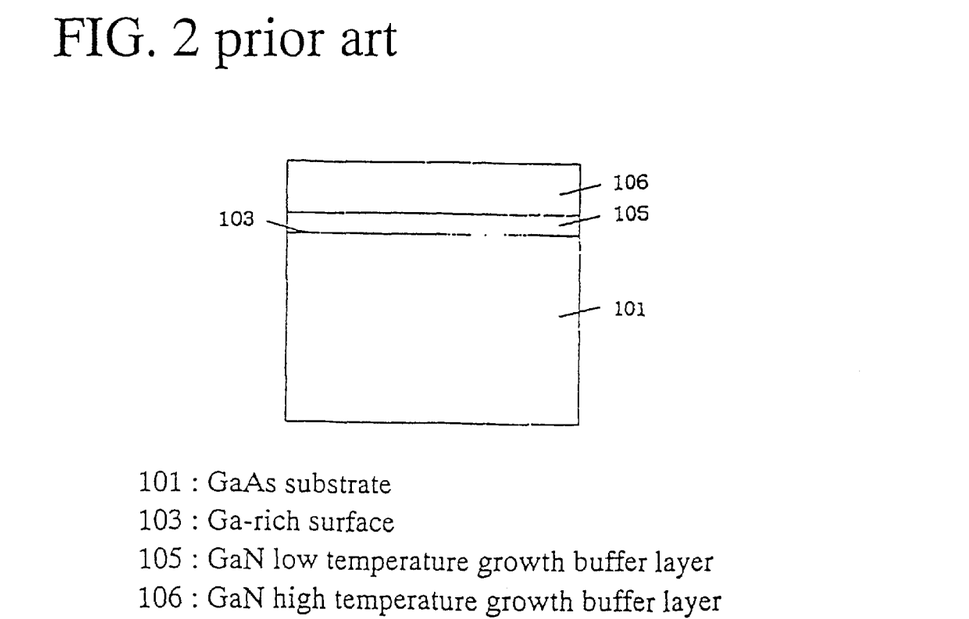
FIG. 2 (Prior Art) is a fragmentary cross sectional elevation view illustrative of a conventional method of crystal growth of a GaN layer over a GaAs substrate.
Figure 3:
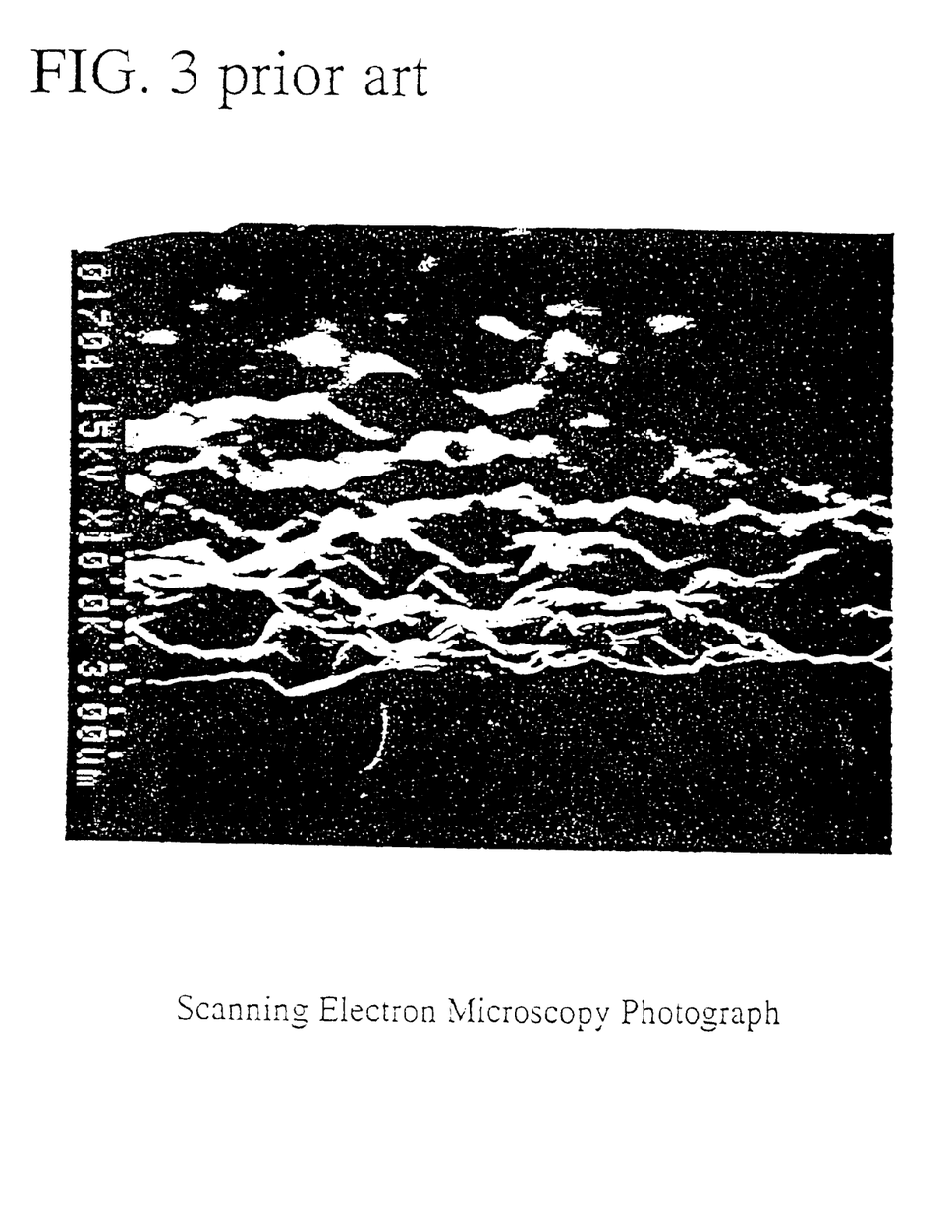
FIG. 3 (Prior Art) is a scanning electron microscopy photograph showing a section and surface of a GaN layer formed over a GaAs substrate by the conventional crystal growth method using hydride vapor phase epitaxy.

There is a method of initial nitrization wherein only a group-III element is supplied as a source material along with a carrier gas for formation of a Ga surface before a group-V element is supplied as a source material along with a carrier gas for the initial nitrization. FIG. 3 is a scanning electron microscopy photograph showing section and surface of a GaN layer formed over the GaAs substrate by a hydride vapor phase epitaxy. FIG. 2 is a fragmentary cross sectional elevation view illustrative of a GaN layer formed over a GaAs substrate. A GaAs substrate 101 has a surface tilted by 5 degrees from (100) surface toward [111]B. The GaAs substrate 101 is doped with CrO at a concentration of 0.33 weight ppm. GaCl is supplied along with a carrier gas onto this GaAs substrate 101 for formation of a Ga-rich surface 103 on the GaAs substrate 101 before a GaN low temperature growth buffer layer 105 is grown at a low temperature over the Ga-rich surface 103. Further, a GaN high temperature growth buffer layer 106 is grown at a high temperature over the GaN low temperature growth buffer layer 105. Both the GaN low temperature growth buffer layer 105 and the GaN high temperature growth buffer layer 106 are undoped. The concrete crystal growth processes are as follows.

While $AsH_3$ is being supplied with a carrier gas of hydrogen, the substrate 101 is heated to a substrate temperature in the range of 630° C. to 640° C. for five minutes so that any oxide film is removed and an As surface is formed on the substrate 101. The substrate temperature is then dropped to 485° C. GaCl is supplied together with a nitrogen carrier gas for thirty seconds to form a Ga-rich surface 103 on the As surface of the substrate 101. A GaN low temperature growth buffer layer 105 is then grown at a low temperature for thirty seconds on the Ga-rich surface 103. Finally, a GaN high temperature growth buffer layer 106 is grown at a high temperature of 700° C. for thirty seconds on the GaN low temperature growth buffer layer 105.

FIG. 3 illustrates the of a rough surface of the GaN high temperature growth buffer layer 106. The planarity of the surface of the GaN high temperature growth buffer layer 106 is inferior. Such rough surface and inferior planarity of the GaN high temperature growth buffer layer 106 are caused by the Ga-rich layer 103 being not more than a Ga mono-atomic layer and an insufficient initial nitrization of the surface of the GaAs substrate 101 with supplying the group-V element along with the carrier gas.

As described above, if a GaN layer is grown over a GaAs substrate by the crystal growth, then the GaN layer is inferior in surface planarity.

In the above circumstances, it had been required to develop a novel method of crystal growth of a GaN layer with an extremely high surface planarity over a GaAs substrate.

SUMMARY OF THE INVENTION

Accordingly, it is an object of the present invention to provide a novel method of crystal growth of a GaN layer with an extremely high surface planarity over a GaAs substrate.

The present invention provides a novel method of crystal growth of a GaN layer with an extremely high surface planarity over a GaAs substrate, wherein a GaAs substrate is heated at a temperature in the range of 600° C. to 700° C. without supplying any group-V element including arsenic to form a Ga-rich surface on the GaAs substrate, before a first source material including N and a second source material including Ga are supplied along with a carrier gas onto a surface of the GaAs substrate to form a GaN layer over the GaAs substrate.

BRIEF DESCRIPTIONS OF THE DRAWINGS

Preferred embodiments of the present invention will be described in detail with reference to the accompanying drawings.

DISCLOSURE OF THE INVENTION

The present invention provides a method of crystal growth of a GaN layer with an extremely high surface planarity over a GaAs substrate, wherein a GaAs substrate is heated to a temperature in the range of 600° C. to 700° C. without supplying any group-V element source material including arsenic to thereby form a Ga-rich surface on the GaAs substrate, before a first source material including N and a second source material including Ga are supplied along with a carrier gas onto a surface of the GaAs substrate to form a GaN layer over the GaAs substrate.

It is preferable that a GaAs buffer layer is further formed over the GaAs substrate before the GaAs substrate is heated.

It is also preferable that only a group-V source material including N is supplied along with the carrier gas onto a surface of the GaAs substrate for nitrization of a surface of the GaAs substrate before the first and second source materials are supplied.

It is also preferable that the GaAs substrate is heated in a reduction atmosphere.

It is also preferable that the GaN layer is grown by a hydride vapor phase epitaxy.

It is also preferable that the GaN layer is grown at a low temperature for an initial period and then grown at a high temperature for a later period.

It is also preferable that the GaAs substrate has a surface slightly tilted from a (100) surface toward a [111]B direction.

It is also preferable that the GaAs substrate is doped with CrO at a concentration of 0.33 weight ppm.

It is also preferable that the GaAs substrate is heated to a temperature in the range of 620° C. to 650° C.

The present invention also provides a method of crystal growth of a GaN layer with an extremely high surface planarity over a GaAs substrate. The method comprises the following steps. With only hydrogen being supplied, a GaAs substrate is subjected to a heat treatment at a first temperature in the range of 630° C. to 640° C. to remove any oxide film from a surface of the GaAs substrate and form a Ga-rich surface on the GaAs substrate. The temperature of the GaAs substrate then is dropped to a second lower temperature for subsequent supply of GaCl and ammonia along with a nitrogen carrier gas onto the Ga-rich surface on the GaAs substrate to grow a thin GaN buffer layer over the Ga-rich surface. The temperature of the GaAs substrate then is raised to a third temperature higher than the first temperature for subsequent growth of a GaN layer over the GaN buffer layer.

It is preferable that the second temperature is 485° C. and the third temperature is 700° C.

The present invention also provides a method of crystal growth of a GaN layer with an extremely high surface planarity over a GaAs substrate. The method comprises the following steps. A GaAs buffer layer is formed over a GaAs substrate. With only hydrogen being supplied, a GaAs substrate is then subjected to a heat treatment at a first temperature in the range of 630° C. to 640° C. to form a Ga-rich surface on the GaAs buffer layer. The temperature of the GaAs substrate then is dropped to a second lower temperature for subsequent supply of GaCl and ammonia along with a nitrogen carrier gas onto the Ga-rich surface on the GaAs substrate to grow a thin GaN buffer layer over the Ga-rich surface. The temperature of the GaAs substrate then is raised to a third temperature higher than the first temperature for subsequent growth of a GaN layer over the GaN buffer layer.

It is also preferable that the second temperature is 485° C. and the third temperature is 700° C.

The present invention provides a method of crystal growth of a GaN layer with an extremely high surface planarity over a GaAs substrate. The method comprises the following steps. With only hydrogen being supplied, a GaAs substrate is subjected to a heat treatment at a first temperature in the range of 630° C. to 640° C. to remove any oxide film from a surface of the GaAs substrate and form a Ga-rich surface on the GaAs substrate. The temperature of the GaAs substrate then is dropped to a second lower temperature for subsequent supply of an ammonia containing carrier gas onto the Ga-rich surface on the GaAs substrate for nitrization of a surface of the GaAs substrate. GaCl and ammonia are supplied along with a nitrogen carrier gas onto the Ga-rich surface on the GaAs substrate to grow a thin GaN buffer layer over the Ga-rich surface. The temperature of the GaAs substrate then is raised to a third temperature higher than the first temperature for subsequent growth of a GaN layer over the GaN buffer layer.

It is also preferable that the second temperature is 485° C. and the third temperature is 700° C.

The present invention also provides a method of crystal growth of a GaN layer with an extremely high surface planarity over a GaAs substrate. The method comprises the following steps. A GaAs buffer layer is formed over a GaAs substrate. With only hydrogen being supplied, a GaAs substrate is subjected to a heat treatment at a first temperature in the range of 630° C. to 640° C. to remove any oxide film from a surface of the GaAs substrate and form a Ga-rich surface on the GaAs substrate. The temperature of the GaAs substrate then is dropped to a lower temperature for subsequent supply of an ammonia containing carrier gas onto the Ga-rich surface on the GaAs substrate for nitrization of a surface of the GaAs substrate. GaCl and ammonia are supplied along with a nitrogen carrier gas onto the Ga-rich surface on the GaAs substrate to grow a thin GaN buffer layer over the Ga-rich surface. The temperature of the GaAs substrate then is raised to a third temperature higher than the first temperature for subsequent growth of a GaN layer over the GaN buffer layer.

It is also preferable that the second temperature is 485° C. and the third temperature is 700° C.

As described above, in accordance with the present invention, a novel method of crystal growth of a GaN layer with an extremely high surface planarity over a GaAs substrate, wherein a GaAs substrate is heated at a temperature in the range of 600° C. to 700° C. without supplying any group-V element including arsenic to form a Ga-rich surface on the GaAs substrate, before a first source material including N and a second source material including Ga are supplied along with a carrier gas onto a surface of the GaAs substrate to form a GaN layer over the GaAs substrate.

It is preferable that a GaAs buffer layer is formed over a GaAs substrate for subsequent heating the GaAs substrate at a temperature in the range of 600° C. to 700° C. without supplying any group-V element including arsenic to form a Ga-rich surface on the GaAs substrate, before a first source material including N and a second source material including Ga are supplied along with a carrier gas onto a surface of the GaAs substrate to form a GaN layer over the GaAs substrate.

It is also preferable that a GaAs substrate is heated at a temperature in the range of 600° C. to 700° C. without supplying any group-V element including arsenic to form a Ga-rich surface on the GaAs substrate, before only a group-V source material including N is supplied along with a carrier gas onto a surface of the GaAs substrate for nitrization of a surface of the GaAs substrate for subsequent supply of both a first source material including N and a second source material including Ga along with a carrier gas onto the surface of the GaAs substrate to form a GaN layer over the GaAs substrate.

It is also preferable that a GaAs buffer layer is formed over a GaAs substrate prior to a heat treatment of a GaAs substrate at a temperature in the range of 600° C. to 700° C. without supplying any group-V element including arsenic to form a Ga-rich surface on the GaAs substrate, before only a group-V source material including N is supplied along with a carrier gas onto a surface of the GaAs substrate for nitrization of a surface of the GaAs substrate for subsequent supply of both a first source material including N and a second source material including Ga along with a carrier gas onto the surface of the GaAs substrate to form a GaN layer over the GaAs substrate.

It is also preferable that the GaAs substrate is heated at a temperature in the range of 620° C. to 650° C. without supplying any group-V element including arsenic.

It is possible that the GaN layer is grown over the GaAs substrate by a hydride vapor phase epitaxy.

The above present invention will more concretely be described with reference to FIGS. 4 and 5.

Figure 4:
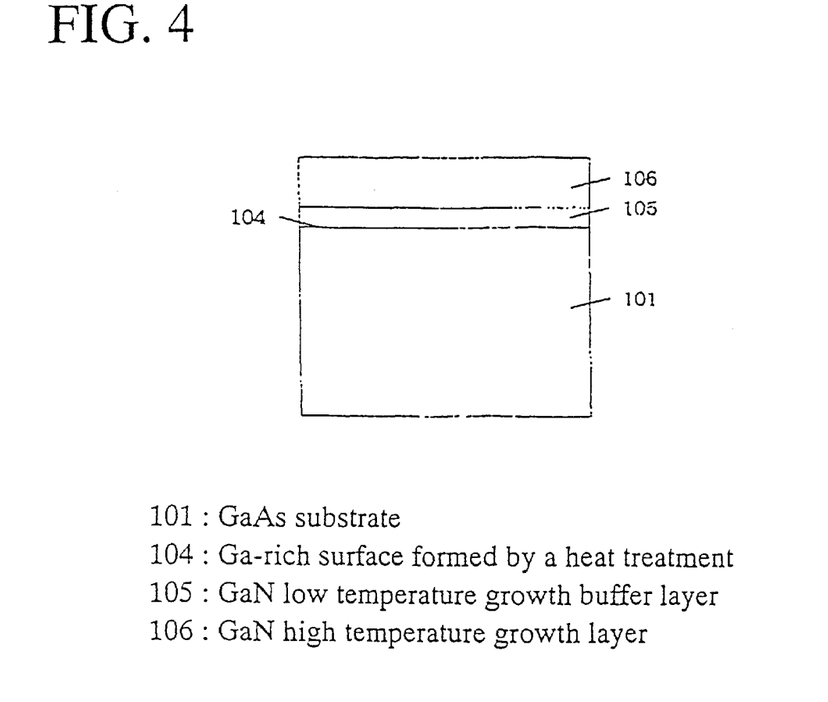
FIG. 4 is a fragmentary cross sectional elevation view illustrative of a method of crystal growth of a GaN layer over a GaAs substrate in each of first and third embodiments according to the present invention.

With reference to FIG. 4, a GaAs substrate 101 is prepared. The GaAs substrate 101 is heated at a temperature in the range of 600° C. to 700° C., more preferably 620° C. to 650° C., without supplying any group-V element including arsenic to thereby form a Ga-rich surface 104 on the GaAs substrate 101. A thin GaN low temperature growth buffer layer 105 is grown over the Ga-rich surface 104 by vapor phase epitaxy such as a hydride vapor phase epitaxy at a relatively low temperature. A thick GaN high temperature growth layer 106 is grown over the thin GaN low temperature growth buffer layer 105 at a relatively high temperature. The thin GaN low temperature growth buffer layer 105 is a buffer layer for absorbing a stress strain due to a large difference in lattice constant between GaAs and GaN.

Nitrogen is used as a carrier gas. GaCl is used as a group-III element gas. Ammonia is further used as a group-V element gas. The crystal growth of the thin GaN low temperature growth buffer layer 105 is effected at a substrate temperature in the range of 460° C. to 500° C. The crystal growth of the thick GaN high temperature growth layer 106 is effected at a substrate temperature in the range of 680° C. to 770° C.

In accordance with the present invention, a Ga-rich surface is formed over a GaAs substrate by heat treatment of the GaAs substrate before the GaN layer is formed over the Ga-rich surface and subsequently a group-V element is supplied along with a carrier gas onto the Ga-rich surface for allowing a sufficient initial nitrization of the GaAs substrate surface, with the result that the GaN layer formed over the GaAs substrate is superior in surface planarity.

Figure 5:
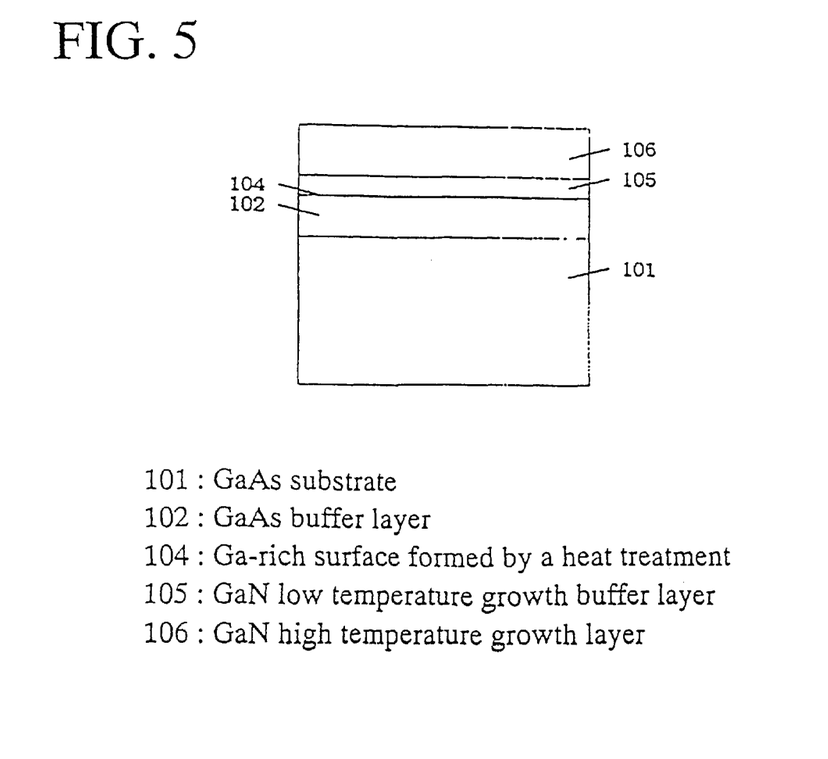
FIG. 5 is a fragmentary cross sectional elevation view illustrative of a method of crystal growth of a GaN layer over a GaAs substrate in each of second and fourth embodiments according to the present invention.

With reference to FIG. 5, a GaAs substrate 101 is prepared. A GaAs buffer layer 102 is formed on a surface of the GaAs substrate 101. The GaAs substrate 101 is heated at a temperature in the range of 600° C. to 700° C., more preferably 620° C. to 650° C., without supplying any group-V element including arsenic to thereby form a Ga-rich surface 104 on the. GaAs buffer layer 102. A thin GaN low temperature growth buffer layer 105 is grown over the Ga-rich surface 104 by vapor phase epitaxy such as a hydride vapor phase epitaxy at a relatively low temperature. A thick GaN high temperature growth layer 106 is grown over the thin GaN low temperature growth buffer layer 105 at a relatively high temperature. The thin GaN low temperature growth buffer layer 105 is a buffer layer for absorbing a stress strain due to a large difference in lattice constant between GaAs and GaN.

Nitrogen is used as a carrier gas. GaCl is used as a group-III element gas. Ammonia is further used as a group-V element gas. The crystal growth of the thin GaN low temperature growth buffer layer 105 is effected at a substrate temperature in the range of 460° C. to 500° C. The crystal growth of the thick GaN high temperature growth layer 106 is effected at a substrate temperature in the range of 680° C. to 770° C.

In accordance with the present invention, a Ga-rich surface is formed over a GaAs buffer layer by heat treatment of the GaAs substrate before the GaN layer is formed over the Ga-rich surface and subsequently the group-V element is supplied along with the carrier gas onto the Ga-rich surface for allowing a sufficient initial nitrization of the GaAs substrate surface, with the result that the GaN layer formed over the GaAs substrate is superior in surface planarity.

In accordance with the present invention, a GaAs substrate is heated to a temperature in the range of 600° C. to 700° C. without supplying any group-V element including arsenic to form a Ga-Tich surface on the GaAs substrate for allowing a sufficient initial nitrization of the GaAs substrate surface by supplying a group-V element along with a carrier gas onto a surface of the GaAs substrate to form a GaN layer with an extremely high surface planarity over the GaAs substrate. If the GaAs buffer layer is further formed over the GaAs substrate, then the surface planarity of the GaN layer over the GaAs substrate is further improved. The surface planarity of the GaN layer over the GaAs substrate is especially superior when the GaAs substrate is heated to a temperature in the range of 620° C. to 650° C. without supplying a group-V element source material including arsenic.

In place of the undoped GaN layer, a doped GaN layer may be formed by crystal growth in accordance with the present invention.

It is possible to further form other GaN layers or other semiconductor layer over a GaN layer formed in accordance with the present invention.

PREFERRED EMBODIMENTS

Figure 6:
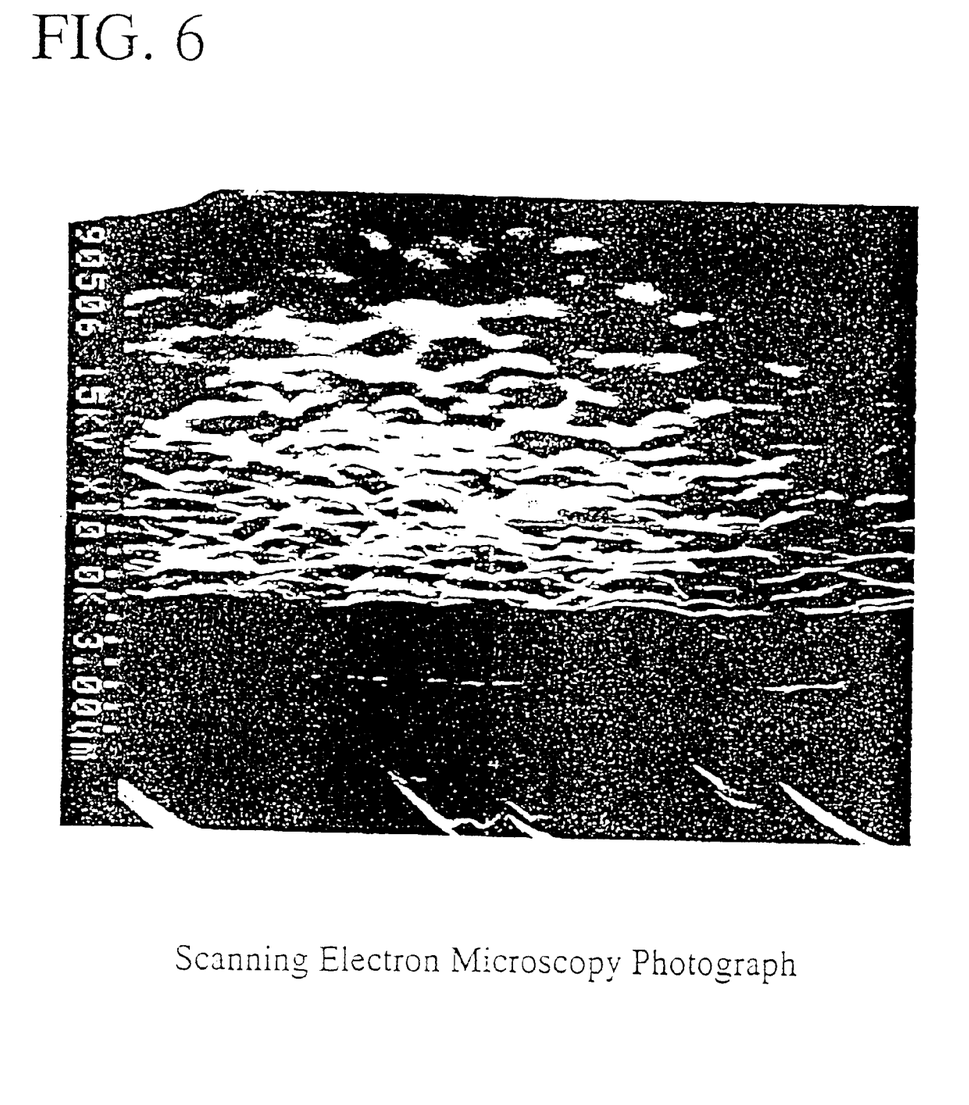
FIG. 6 is a scanning electron microscopy photograph showing a section and surface of a GaN layer formed over a GaAs substrate by a novel crystal growth in a first embodiment according to the present invention.

A first embodiment according to the present invention will be described with reference to FIGS. 4 and 6, wherein there is provided a novel method of crystal growth using a hydride vapor phase epitaxy of a GaN layer with an extremely high surface planarity over a GaAs substrate. FIG. 6 is a scanning electron microscopy photograph showing the section and surface of a GaN layer formed over a GaAs substrate by a novel crystal growth in a first embodiment according to the present invention.

With reference to FIG. 4, a GaAs substrate 101 is prepared, which has a surface tilted by 5 degrees from a (100) surface toward a [111]B direction. The GaAs substrate 101 is doped with CrO at a concentration of 0.33 weight ppm. With only hydrogen being supplied, the GaAs substrate 101 is heated to a temperature in the range of 630° C. to 640° C. for five minutes to remove any oxide film from a surface of the GaAs substrate 101 and form a Ga-rich surface 104 on the GaAs substrate 101. The substrate temperature is dropped to a temperature of 485° C. for subsequent supply of GaCl and Ammonia along with a nitrogen carrier gas onto the Ga-rich surface 104 on the GaAs substrate 101 for thirty minutes to grow a thin GaN low temperature growth buffer layer 105 over the Ga-rich surface 104. The substrate temperature is raised to a temperature of 700° C. for subsequent growth of a thick GaN high temperature growth layer 106 over the thin GaN low temperature growth buffer layer 105 for thirty minutes. The thin GaN low temperature growth buffer layer 105 is a buffer layer for absorbing stress strain due to a large difference in lattice constant between GaAs and GaN. Both the thin GaN low temperature growth buffer layer 105 and the thick GaN high temperature growth layer 106 are undoped.

The GaN layer 106 illustrated in FIG. 6 is superior in surface planarity to the GaN layer illustrated in FIG. 3.

Figure 7:
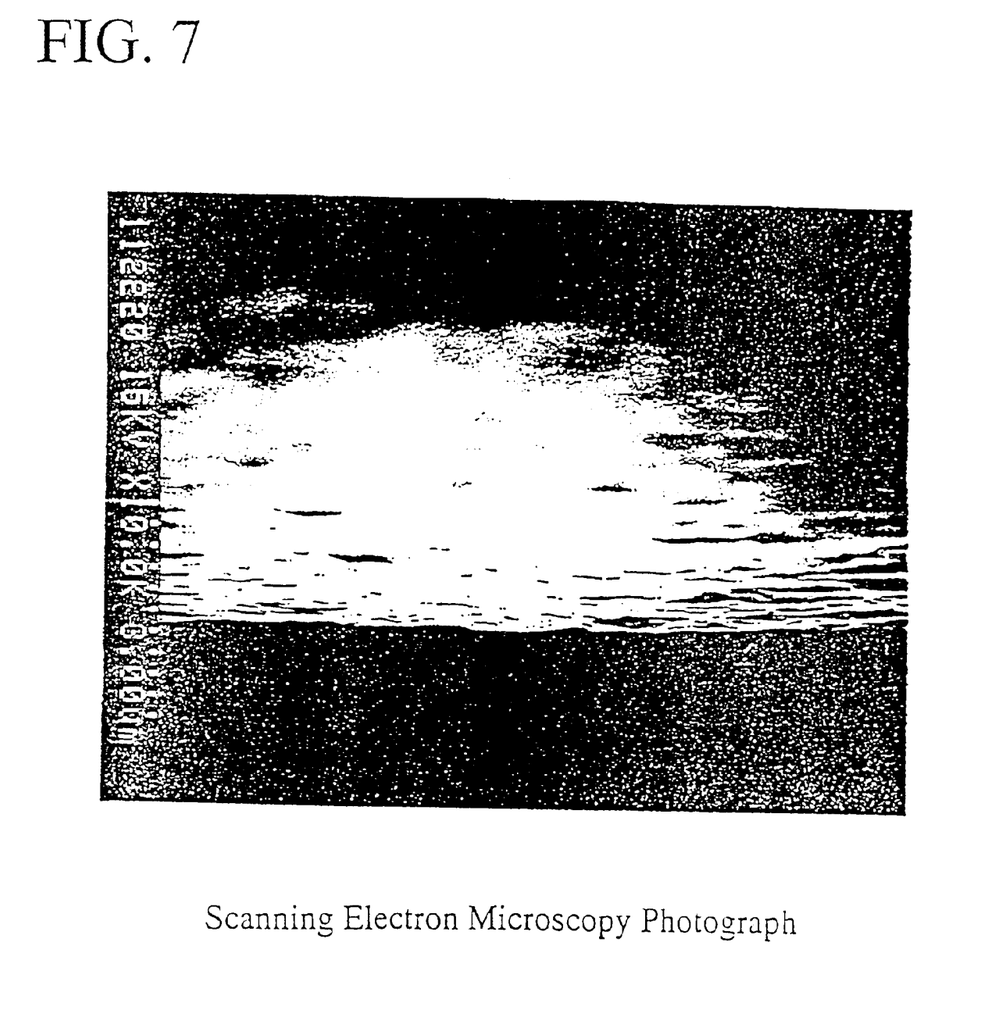
FIG. 7 is a scanning electron microscopy photograph showing a section and surface of a GaN layer formed over a GaAs substrate by a novel crystal growth in a second embodiment according to the present invention.

A second embodiment according to the present invention will be described with reference to FIGS. 5 and 7, wherein there is provided a novel method of crystal growth using a hydride vapor phase epitaxy of a GaN layer with an extremely high surface planarity-over a GaAs substrate. FIG. 7 is a scanning electron microscopy photograph showing the section and surface of a GaN layer formed over a GaAs substrate by a novel crystal growth in a second embodiment according to the present invention.

With reference to FIG. 5, a GaAs substrate 101 is prepared, which has a surface tilted by 5 degrees from a (100) surface toward a [111]B direction. The GaAs substrate 101 is doped with CrO at a concentration of 0.33 weight ppm. A GaAs buffer layer 102 having a thickness of 1.0 micrometer is formed over the GaAs substrate 101. With only hydrogen being supplied, the GaAs substrate 101 is heated to a temperature in the range of 630° C. to 640° C. for five minutes to form a Ga-rich surface 104 on GaAs buffer layer 102 over the GaAs substrate 101. The substrate temperature is dropped to a temperature of 485° C. for subsequent supply of GaCl and Ammonia along with a nitrogen carrier gas onto the Ga-rich surface 104 on GaAs buffer layer 102 over the GaAs substrate 101 for thirty minutes to grow a thin GaN low temperature growth buffer layer 105 over the Ga-rich surface 104. The substrate temperature is raised to a temperature of 700° C. for subsequent growth of a thick GaN high temperature growth layer 106 over the thin GaN low temperature growth buffer layer 105 for thirty minutes. The thin GaN low temperature growth buffer layer 105 is a buffer layer for absorbing stress strain due to a large difference in lattice constant between GaAs and GaN. Both the thin GaN low temperature growth buffer layer 105 and the thick GaN high temperature growth layer 106 are undoped.

The GaN layer 106 illustrated in FIG. 7 is much superior in surface planarity to the GaN layer illustrated in FIG. 3. The GaN layer 106 illustrated in FIG. 7 is still superior in surface planarity than the GaN layer illustrated in FIG. 6.

Figure 8:
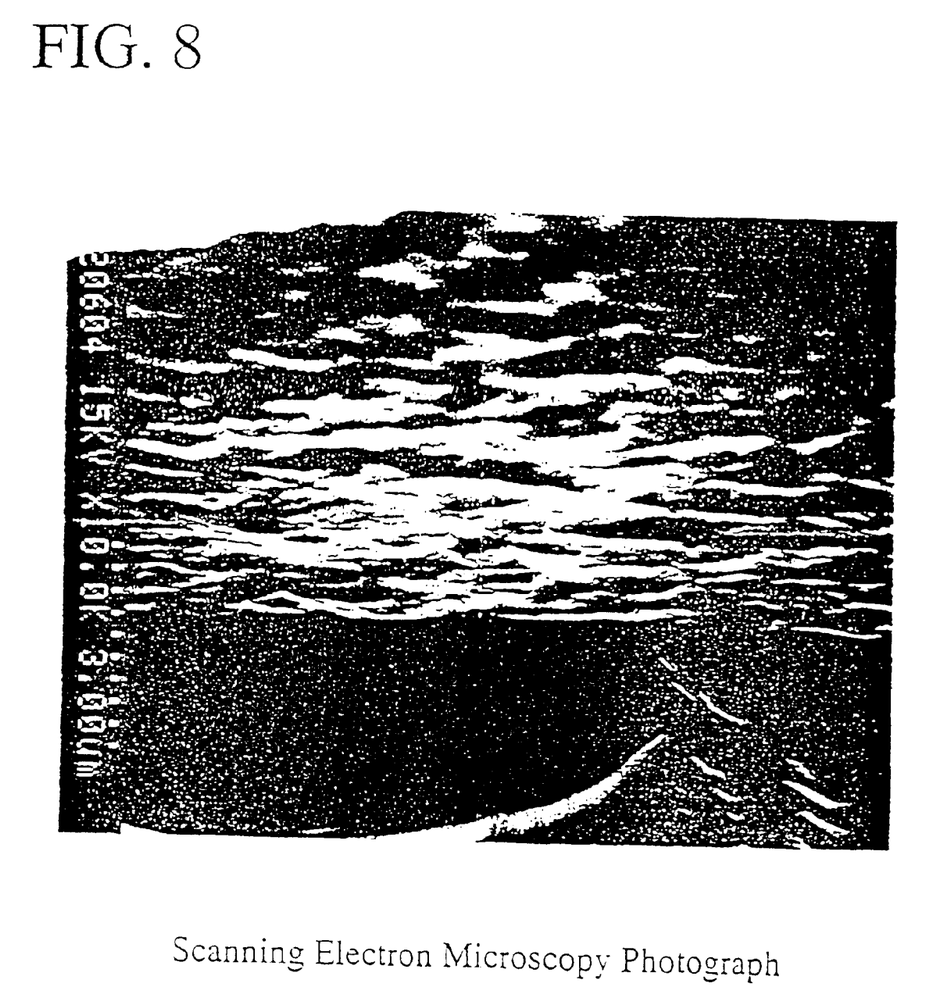
FIG. 8 is a scanning electron microscopy photograph showing a section and surface of a GaN layer formed over a GaAs substrate by a novel crystal growth in a third embodiment according to the present invention.

A third embodiment according to the present invention will be described with reference to FIGS. 4 and 8, wherein there is provided a novel method of crystal growth using a hydride vapor phase epitaxy of a GaN layer with an extremely high surface planarity over a GaAs substrate. FIG. 8 is a scanning electron microscopy photograph showing the section and surface of a GaN layer formed over a GaAs substrate by a novel crystal growth in a third embodiment according to the present invention.

With reference to FIG. 8, a GaAs substrate 101 is prepared, which has a surface tilted by 5 degrees from a (100) surface toward a [111]B direction. The GaAs substrate 101 is doped with CrO at a concentration of 0.33 weight ppm. With only hydrogen being supplied, the GaAs substrate 101 is heated to a temperature in the range of 630° C. to 640° C. for five minutes to remove any oxide film from a surface of the GaAs substrate 101 and form a Ga-rich surface 104 on the GaAs substrate 101. The substrate temperature is dropped to a temperature of 485° C. for subsequent supply of an ammonia containing carrier gas onto the Garich surface 104 on the GaAs substrate 101 for nitrization of a surface of the GaAs substrate 101. GaCl and Anmonia along with a nitrogen carrier gas are supplied onto the Ga-rich surface 104 over the GaAs substrate 101 for thirty minutes to grow a thin GaN low temperature growth buffer layer 105 over the Ga-rich surface 104. The substrate temperature is raised to a temperature of 700° C. for subsequent growth of a thick GaN high temperature growth layer 106 over the thin GaN low temperature growth buffer layer 105 for thirty minutes. The thin GaN low temperature growth buffer layer 105 is a buffer layer for absorbing stress strain due to a large difference in lattice constant between GaAs and GaN. Both the thin GaN low temperature growth buffer layer 105 and the thick GaN high temperature growth layer 106 are undoped.

The GaN layer 106 illustrated in FIG. 8 is superior in surface planarity to the GaN layer illustrated in FIG. 3.

Figure 9:
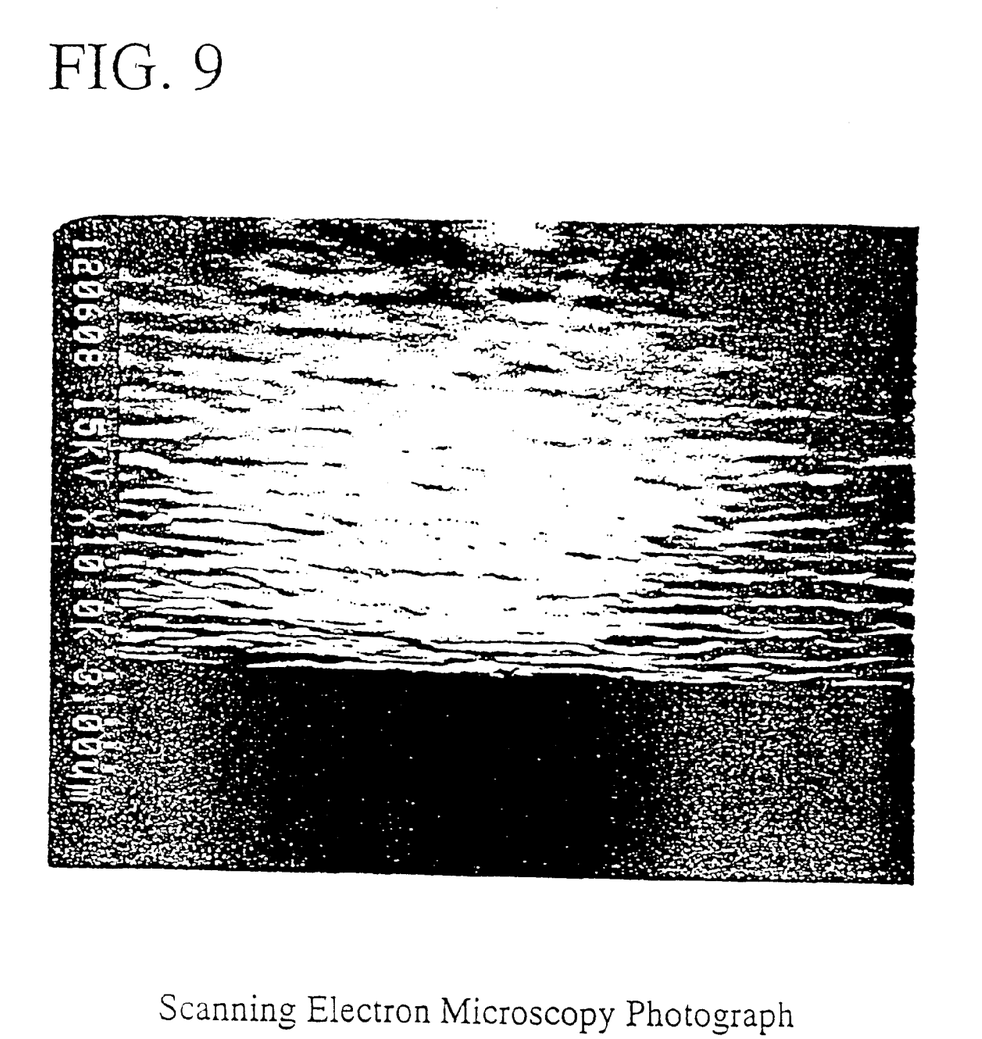
FIG. 9 is a scanning electron microscopy photograph showing a section and surface of a GaN layer formed over a GaAs substrate by a novel crystal growth in a fourth embodiment according to the present invention.

A fourth embodiment according to, the present invention will be described with reference to FIGS. 5 and 9, wherein there is provided a novel method of crystal growth using a hydride vapor phase epitaxy of a GaN layer with an extremely high surface planarity over a GaAs substrate. FIG. 9 is a scanning electron microscopy photograph showing the section and surface of a GaN layer formed over a GaAs substrate by a novel crystal growth in a fourth embodiment according to the present invention.

With reference to FIG. 5, a GaAs substrate 101 is prepared, which has a surface tilted by 5 degrees from a (100) surface toward a [111]B direction. The GaAs substrate 101 is doped with CrO at a concentration of 0.33 weight ppm. A GaAs buffer layer 102 having a thickness of 1.0 micrometer is formed over the GaAs substrate 101. With only hydrogen being supplied, the GaAs substrate 101 is heated to a temperature in the range of 630° C. to 640° C. for five minutes to form a Ga-rich surface 104 on GaAs bufer layer 102 over the GaAs substrate 101. The substrate temperature is dropped to a temperature of 485° C. for subsequent supply of an ammonia containing carrier gas onto the Ga-rich surface 104 on the GaAs substrate 101 for nitrization of a surface of the GaAs substrate 101. GaCl and ammonia along with a nitrogen carrier gas are then supplied onto the Ga-rich surface 104 over the GaAs substrate 101 for thirty minutes to grow a thin GaN low temperature growth buffer layer 105 over the Ga-rinch surface 104. The substrate temperature is raised to a temperature of 700° C. for subsequent growth of a thick GaN high temperature growth layer 106 over the thin GaN low temperature growth buffer layer 105 for thirty minutes. The thin GaN low temperature growth buffer layer 105 is a buffer layer for absorbing stress strain due to a large difference in lattice constant between GaAs and GaN. Both the thin GaN low temperature growth buffer layer 105 and the thick GaN high temperature growth layer 106 are undoped.

The GaN layer 106 illustrated in FIG. 9 is much superior in surface planarity to the GaN layer illustrated in FIG. 3. The GaN layer 106 illustrated in FIG. 9 is still superior in surface planarity than the GaN layer illustrated in FIG. 8.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A method of crystal growth of a GaN layer with an extremely high surface planarity over a GaAs substrate, wherein a GaAs substrate is heated to a temperature in the range of 600° C. to 700° C. without supplying any group-V element source material including arsenic to thereby form a Ga-rich surface on the GaAs substrate, before a first source material including N and a second source material including Ga are supplied along with a carrier gas onto a surface of the GaAs substrate to form a GaN layer over the GaAs substrate.

2. The method as claimed in claim 1, wherein a GaAs buffer layer is further formed over the GaAs substrate before the GaAs substrate is heated.

3. The method as claimed in claim 1, wherein only a group-V source material including N is supplied along with the carrier gas onto a surface of the GaAs substrate for nitrization of a surface of the GaAs substrate before the first and second source materials are supplied.

4. The method as claimed in claim 1, wherein the GaAs substrate is heated in a reduction atmosphere.

5. The method as claimed in claim 1, wherein the GaN layer is grown by a hydride vapor phase epitaxy.

6. The method as claimed in claim 1, wherein the GaN layer is grown at a low temperature for an initial period and then grown at a high temperature for a later period.

7. The method as claimed in claim 1, wherein the GaAs substrate has a surface slightly tilted from a (100) surface toward a [111]B direction.

8. The method as claimed in claim 7, wherein the GaAs substrate is doped with CrO at a concentration of 0.33 weight ppm.

9. The method as claimed in claim 1, wherein the GaAs substrate is heated to a temperature in the range of 620° C. to 650° C.

10. A method of crystal growth of a GaN layer with an extremely high surface planarity over a GaAs substrate, said method comprising the steps of:

subjecting, with only hydrogen being supplied, a GaAs substrate to a heat treatment at a first temperature in the range of 630° C. to 640° C. to remove any oxide film from a surface of the GaAs substrate and form a Ga-rich surface on the GaAs substrate;

dropping the temperature of the GaAs substrate to a second temperature lower than the first temperature and supplying GaCl and ammonia along with a nitrogen carrier gas onto the Ga-rich surface on the GaAs substrate to grow a thin GaN buffer layer over the Ga-rich surface; and raising the temperature of the GaAs substrate to a third temperature higher than the first temperature and growing a GaN layer over the GaN buffer layer.

11. The method as claimed in claim 10, wherein said second temperature is 485° C. and the third temperature is 700° C.

12. A method of crystal growth of a GaN layer with an extremely high surface planarity over a GaAs substrate, said method comprising the steps of:

forming a GaAs buffer layer over a GaAs substrate;

subjecting, with only hydrogen being supplied, a GaAs substrate to a heat treatment at a first temperature in the range of 630° C. to 640° C. to form a Ga-rich surface on the GaAs buffer layer;

dropping the temperature of the GaAs substrate to a second temperature lower than the first temperature and supplying GaCl and ammonia along with a nitrogen carrier gas onto the Ga-rich surface on the GaAs substrate to grow a thin GaN buffer layer over the Ga-rich surface; and raising the temperature of the GaAs substrate to a third temperature higher than the first temperature and growing a GaN layer over the GaN buffer layer.

13. The method as claimed in claim 12, wherein said second temperature is 485° C. and the third temperature is 700° C.

14. A method of crystal growth of a GaN layer with an extremely high surface planarity over a GaAs substrate, said method comprising the steps of:

subjecting, with only hydrogen being supplied, a GaAs substrate to a heat treatment at a first temperature in the range of 630° C. to 640° C. to remove any oxide film from a surface of the GaAs substrate and form a Ga-rich surface on the GaAs substrate;

dropping the temperature of the GaAs substrate to a second temperature lower than the first temperature and supplying an ammonia containing carrier gas onto the Ga-rich surface on the GaAs substrate for nitrization of a surface of the GaAs substrate;

supplying GaCl and ammonia along with a nitrogen carrier gas onto the Ga-rich surface on the GaAs substrate to grow a thin GaN buffer layer over the Ga-rich surface; and raising the temperature of the GaAs substrate to a third temperature higher than the first temperature and growing a GaN layer over the GaN buffer layer.

15. The method as claimed in claim 14, wherein said second temperature is 485° C. and the third temperature is 700° C.

16. A method of crystal growth of a GaN layer with an extremely high surface planarity over a GaAs substrate, said method comprising the steps of:

forming a GaAs buffer layer over a GaAs substrate;

subjecting, with only hydrogen being supplied, a GaAs substrate to a heat treatment at a first temperature in the range of 630° C. to 640° C. to remove any oxide film from a surface of the GaAs substrate and form a Ga-rich surface on the GaAs substrate;

dropping the temperature of the GaAs substrate to a second temperature lower than the first temperature and supplying an ammonia containing carrier gas onto the Ga-rich surface on the GaAs substrate for nitrization of a surface of the GaAs substrate;

supplying GaCl and ammonia along with a nitrogen carrier gas onto the Ga-rich surface on the GaAs substrate to grow a thin GaN buffer layer over the Ga-rich surface; and raising the temperature of the GaAs substrate to a third temperature higher than the first temperature and growing of a GaN layer over the GaN buffer layer.

17. The method as claimed in claim 16, wherein said second temperature is 485° C. and the third temperature is 700° C.

* * * * *